US006894630B1

(12) United States Patent
Massie et al.

(10) Patent No.: US 6,894,630 B1
(45) Date of Patent: May 17, 2005

(54) ENHANCED DIRECT DIGITIZING ARRAY ARRANGEMENT

(75) Inventors: Angus Massie, Humbug Scrub (AU); John Kitchen, Teringie (AU); Warren Marwood, Wynn Vale (AU)

(73) Assignee: The Commonwealth of Australia, Edinburgh (AU)

( * ) Notice: Subject to any disclaimer, the term of this patent is extended or adjusted under 35 U.S.C. 154(b) by 127 days.

(21) Appl. No.: 10/129,286
(22) PCT Filed: Nov. 2, 2000
(86) PCT No.: PCT/AU00/01345

§ 371 (c)(1),
(2), (4) Date: Oct. 15, 2002

(87) PCT Pub. No.: WO01/33717

PCT Pub. Date: May 10, 2001

(30) Foreign Application Priority Data

Nov. 2, 1999 (AU) ............................................. PQ 3814

(51) Int. Cl.[7] ................................................ H03M 1/10
(52) U.S. Cl. ..................................... 341/118; 341/155
(58) Field of Search ................................ 341/141, 155

(56) References Cited

U.S. PATENT DOCUMENTS

| 4,675,606 | A |   | 6/1987 | Ganguly |  |
|---|---|---|---|---|---|
| 5,262,789 | A | * | 11/1993 | Silverstein | ................... 342/368 |
| 5,294,926 | A | * | 3/1994 | Corcoran | ..................... 341/120 |
| 5,568,142 | A | * | 10/1996 | Velazquez et al. | .......... 341/126 |
| 5,659,546 | A |   | 8/1997 | Elder |  |
| 5,815,117 | A |   | 9/1998 | Kolanek |  |
| 6,463,093 | B1 | * | 10/2002 | Komara et al. | ............. 375/220 |

FOREIGN PATENT DOCUMENTS

GB    2233518    1/1991
GB    2255457    11/1992

OTHER PUBLICATIONS

Hummels, D.M. et al., Distortion compensation for time–interleaved analog to digital converters, IEEE Instrumentation and Measurement Technology Conference, 1996. IMTC–96. Conference Proceedings., vol. 1, pp.:728–731.*

Tsimbinos, J. et al.; Applications of higher–order statistics to modelling, identification and cancellation of nonlinear distortion in high–speed samplers and analogue–to–digital converters using the Volterra and Wiener models; IEEE Signal Processing Workshop on Higher–Order Statistics, 1993., Jun. 7–9, 1993 pp.: 379–383.*

Derwent Abstract Accession No. 97–090570/09, Class U13U14, JP 08 327681, Class U13U14. total p. 1, Dec. 1996.

(Continued)

*Primary Examiner*—Howard L. Williams
(74) *Attorney, Agent, or Firm*—Beyer Weaver & Thomas LLP

(57) ABSTRACT

The invention comprises an array of ADCs, associated either with spatially separated signal input devices such as for example antennae, or with a single signal input device and a plurality of filters having a variable phase delay, which provide a digital output which is processed to remove spurious signals introduced by the ADCs thereby providing a linearised output. An array of N antennae with respective band pass filters and ADCs (10) feeds received signals into a frequency channelisation device (12) which divides each of the N input streams into M lower bandwidth streams for distribution. In a first path, an FFT (14) is used to detect signal of interest, to determine where intermodulation products arm likely to exist and to provide course data for the spatial processing used in the signal separation sub-systems. The second path (16) includes the detection and separation of co-channels signals. Signal classification techniques are then used to identify spurious sir, which are then removed.

12 Claims, 6 Drawing Sheets

OTHER PUBLICATIONS

IEEE International Conference on Acoustics, Speech and Signal Processing, Apr. 1994.

Tsui, James B–Y. (1989). *Digital Microwave Receivers Theory and Concepts*. Artec House, Inc. total pp. v–viii. (Table of Contents).

Walden, R. H. (Apr. 1999). "Analog–to–Data Survey and Analysis," IEEE SAC 17(4):539–550. at Fig. 5.

Supplementary European Search Report issued Jan. 21, 2003, for EP Patent Application 00 97 2473, two pages.

* cited by examiner

ENHANCED DIRECT DIGITIZING ARRAY ARRANGEMENT

This invention relates to that of an array of ADCs, separated either spatially or with filters having a variable phase delay, which is such a configuration, can provide a higher dynamic range Analogue to Digital conversion than was previously achievable, one application of which is a direct digitising array for radio frequency receivers.

BACKGROUND

Analogue to Digital Converters (ADCs), have been found wanting in the RF area where they are used to convert analogue narrow band IF in a receiver to the digital domain so that demodulation can be performed in ways that can not be achieved using traditional analogue equivalents.

The following description uses the RF area as a good example of an application of the beneficial application of ADCs but it will be apparent to those skilled in the art that the real advance disclosed herein is the novel approach of using an ADC array and the provision of a method to nullify the effects of the inherent non-linearity of ADCs.

Analogue RF front ends for receivers are still preferably used today since:
1. the dynamic range of wide band digitising systems are seen as inferior to that obtained from analogue filters, and
2. the signal processing needed for wide-bandwidth processing is deemed to be both beyond the capacity of affordable DSP engines and unnecessary for an individual receiver which normally attempts to tune only one signal at any instant in time.

During the recent past, these beliefs have become less true, but the highest performing receivers are still undoubtedy analogue superheterodynes that subsequently use digital demodulation techniques (i.e. an analogue front-end with the more flexible digital backend).

Since most users look at the performance of individual receivers, the conventional wisdom is that direct digitising receivers are inferior.

However, a receiver site that shares multiple antennae amongst multiple receivers can make the direct digitizing approach competitive with and potentially exceed conventional analogue systems.

In a large analogue receiver system, there are a number of antennae shared by a number of users. This results in a need to split the incoming RF energy from all the antennae so that any one operator can receive a desired frequency using one or more beams pointing in roughly the right direction. However, every time the received signal is split there is a loss in fidelity (i.e. the Signal to Noise Ratio (SNR) gets a little worse). Further, when independent signals are combined to give directional beams, the finite accuracy of the combiners (typically 2 degrees at 0.1 dB) means that the beams are not precise. Moreover, this approach requires a dedicated receiver for every user, thus users must accept the "best available" beam even if it's not exactly appropriate at the time and even if an unwanted signal (interference) is also on that channel at that time.

Despite these compromises, analogue techniques work. It is however unlikely that any major advance in performance using these techniques is achievable as this technology is well developed.

In the analogue domain, the overall system performance is limited by the performance of the RF front end. However, it is proposed that the use of a suitable analogue to digital architecture can create a digital domain in which appropriate use of signal processing techniques can compensate for many of the imperfections of the conversion process in the front-end thus overall enhancing the system performance.

A single ADC handling two large in-band signals F1 and F2 will, due to non-linearity in the ADC, particularly in the Sample and Hold, produce spurious harmonics and intermodulation products in the output spectrum at F1+F2, 2F1−F2 etc. Thus any small signal on those particular frequencies would be difficult if not impossible to detect or copy, where copy is used to mean reception and demodulation of the transmitted signal without error. Where these harmonics and intermodulation products lie above the Nyquist frequency, they will appear as aliased in-band components with the output of the ADCs. Thus, the largest intermodulation products are considered to limit the useful dynamic range of an ADC.

In an example, a more realistic situation in the H.F. band would be 50 large signals each being 3 kHz wide. This would generate about 2000 in band $2^{nd}$ order, 5000 in band $3^{rd}$ order intermodulation terms. Making some reasonable assumptions of the degree of overlap from the intermodulation products and also realising that the $2^{nd}$ order products are 6 kHz wide, $3^{rd}$ order 9 kHz etc., the total bandwidth corrupted by spurious signals occupies about 25 MHZ of the nominal 30 MHz bandwidth for H.F. Thus, the intermodulation performance determines the performance of a single channel-digitising receiver.

However, if an array of these ADCs were connected to a spatially dispersed antenna array, their largest intermodulation products no longer constitute a performance limit. We can assume that the same two large signals we will still experience the same spurious frequencies from each ADC, but each would have their own apparent angle of arrival. Hence, the Signals Of Interest (SOI) from other directions can still be readily separated using conventional co-channel separation techniques, even if the SOIs are much smaller than the interfering spurious signal.

Using the above approach, it is possible to accept the limited spurious free dynamic range (SFDR) of individual ADC channels induced by ADC non-linearities, but provide a higher system SFDR by using advanced signal processing techniques to remove the spurious signals and so allow small signals which are below the noise floor of individual ADCs to be received for analysis and copy. This approach effectively 'linearises' the non-linear ADCs.

Thus the use of an array of ADCs separated either spatially or with filters having a variable phase delay can provide a higher dynamic range Analogue to Digital conversion than previously achievable thereby offering an alternative arrangement for the use of ADCs than was previously available and also allows for the use of lesser quality ADCs in an arrangement that provides equal or better performance than a single ADC of higher quality.

BRIEF DESCRIPTION OF THE INVENTION

In its broadest aspect, the invention comprises an array of ADCs, associated either with spatially separated signal input devices such as antennae, or with filters having a variable phase delay, which provides a digital output which is processed to remove spurious signals introduced by said ADCs thereby providing a linearised output.

In a further aspect of the invention, an analogue to digital converter (ADC) apparatus for converting one or more analogue signals arriving at a plurality of spatially separated receiver elements comprising: a respective plurality of ADCs receiving from said receiver elements, a version of said one or more analogue signals and converting said analogue signals into digital representations of said analogue signals plus spurious components created by said ADCs; a processing means to identify in said digital representations the spurious components by analysis of the phase relationships of the spectral components of said one or more analogue signals and spurious components according to the spatial relationships between each receiver element and said analogue signals and spurious components; and a filter means to remove said spurious components from said digital representations of said one or more analogue signals.

In a further aspect of the invention the processing means further comprises statistical analysis and separation of independent signal components, and a means to classify signals into spurious components and non-spurious signals.

In a further broad aspect of the invention, an analogue to digital conversion (ADC) apparatus for converting one or more analogue signals arriving at a receiver element comprising: a plurality of ADCs provided respectively with a variable phase delayed version of said one or more analogue signals and converting said analogue signals into digital representations of said analogue signals plus spurious components created by said ADCs; a processing means to identify in said digital representations the spurious components by analysis of the phase relationships of the spectral components of said one or more analogue signals and spurious components according to said phase delays; and a filter means to remove said spurious components from said digital representations of said one or more analogue signals.

A yet further aspect of the invention is a method for removing spurious components from a digital representation of one or more analogue signals generated by a non-linear analogue to digital conversion process comprising the steps of:

a) receiving at a plurality of spatially separated receiver elements said one or more analogue signals;
 b) receiving at a respective plurality of analogue to digital converters variable phase delayed versions of said analogue signals for converting said analogue signals into digital representations of said signals plus spurious components created by said ADCs;
 c) processing said digital representations to identify said spurious components by analysis of the phase relationships of the spectral components of said one or more analogue signals and spurious components according the spatial relationships between each receiver element and said signals and said spurious components; and
 d) filtering to remove said spurious components from said digital representation of said one or more analogue signals.

A yet further aspect of the invention is a method for removing spurious components from a digital representation of one or more analogue signals generated by a non-linear analogue to digital conversion process comprising the steps of:

a) receiving at a receiver element said one or more analogue signals;
 b) receiving at a respective one of said plurality of analogue to digital converters (ADC) a variable phased delayed version of said analogue signals and converting said analogue signals into digital representations of said signals plus spurious components created by said ADCs;
 c) processing said digital representations to identify said spurious components by analysis of the phase relationships of the spectral components of said one or more analogue signals and spurious components according the respective phase delays; and
 d) filter ing to remove said spurious components from said digital representation of said one or more analogue signals.

Specific embodiments of the invention will now be described in some further detail with reference to and as illustrated in the accompanying figures. These embodiments are illustrative, and not meant to be restrictive of the scope of the invention. Suggestions and descriptions of other embodiments may be included but they may not be illustrated in the accompanying figures or alternatively features of the invention may be shown in the figures but not described in the specification.

DETAILED DESCRIPTION OF EMBODIMENTS OF THE INVENTION

It will be appreciated by those skilled in the art, that ADCs are used extensively in the electronics field to translate analogue signals into digital representations of those analogue signals. Such analogue signals are obtained from many different types of sensors some examples including strain gauges, voltage/current measuring devices, temperature measurement devices, etc. Therefore, it will be apparent to those same persons skilled in the art, that the concepts of this invention will provide an improvement in the translation of analogue signals into the digital domain where ever ADCs are used.

Figure 2:
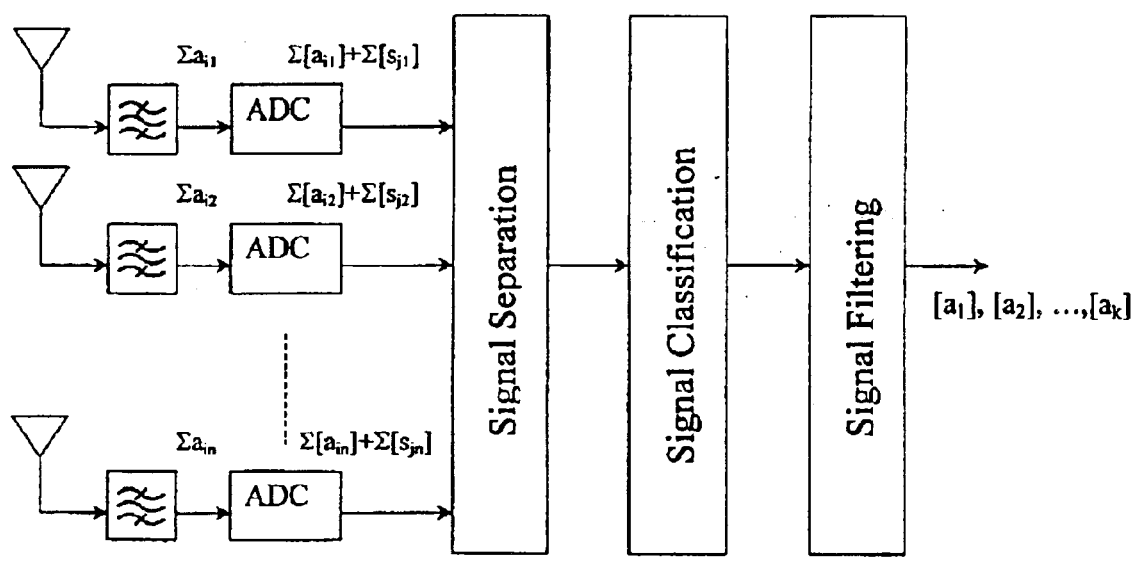
FIG. 2 depicts a functional block diagram of an embodiment of the invention in the RF field using multiple receiving elements.
Figure 3:
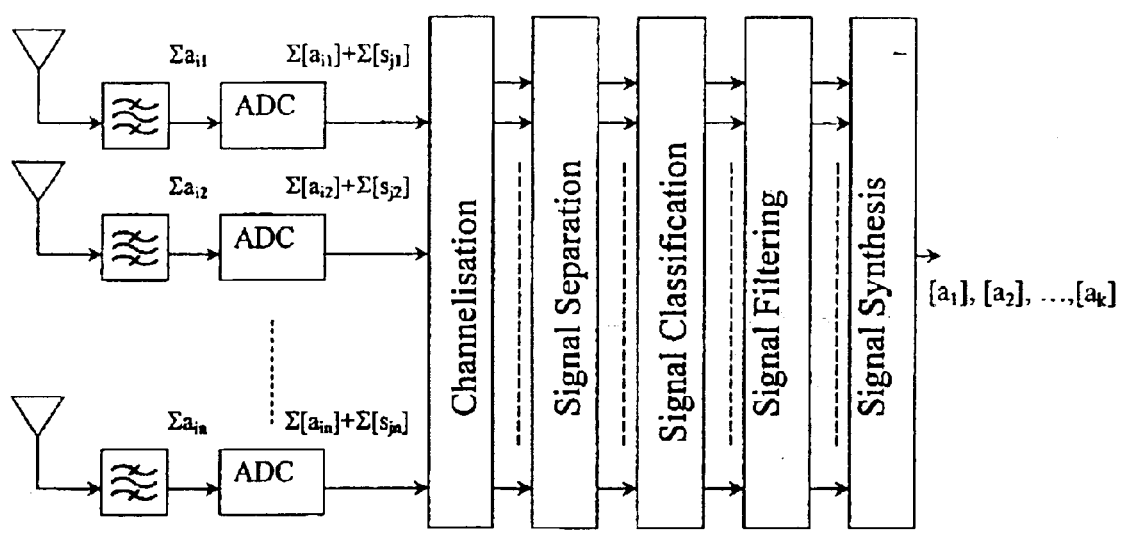
FIG. 3 depicts a functional block diagram of an embodiment of the invention in the RF field using multiple receiving elements with channelising and synthesis.

A specific embodiment of the invention comprises an array of antennae, each with its own wide band receiver or ADC, refer FIGS. 2 and 3. FIG. 3 differs from FIG. 2 in that FIG. 3 includes channelisation and synthesis functional blocks that assist in paralleling the computation of the processing task. One form of channelisation is the division into independent frequency bands. Examples of the implementation of channelising in the frequency domain are the use of poly-phase filter techniques or Fast Fourier transform techniques. Channelising in other domains (e.g. code or spatial) are also possible.

Figure 4:
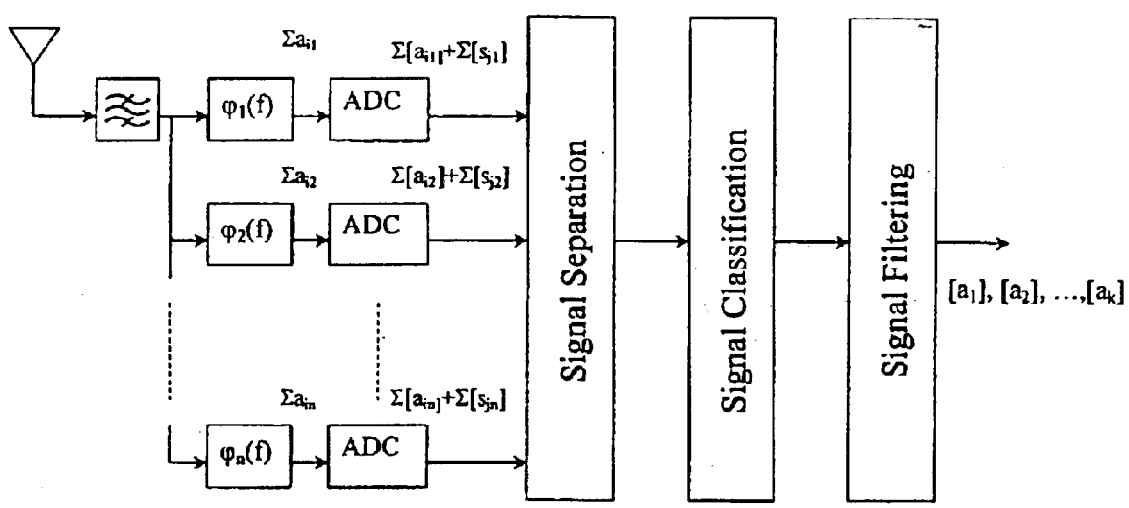
FIG. 4 depicts a functional block diagram of an embodiment of the invention in the RF field using a single receiving element.
Figure 5:
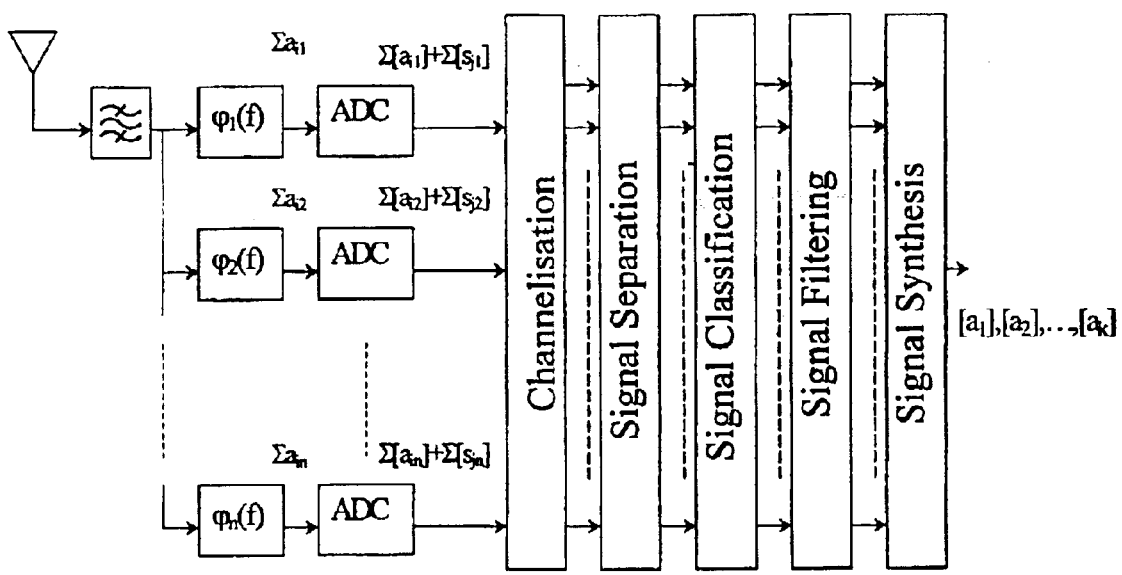
FIG. 5 depicts a functional block diagram of an embodiment of the invention in the RF field using a single receiving element with channelising and synthesis.

A further embodiment of the invention comprises the use of a single antenna that provides variable phase delayed versions of the analogue signals it receives into multiple ADCs, refer FIGS. 4 and 5. FIG. 5 differs from FIG. 4 in that FIG. 5 includes channelisation and synthesis functional blocks that assist in paralleling the computation of the processing task as discussed above. Clearly, the single antenna embodiment is akin to the use of a single receiver element such as a strain gauge or other type of sensor when the invention is applied in a non-RF-based example.

In the FIGS. 2–5 the symbols $\Sigma[a_{i1}]+\Sigma[s_{f1}]$ represent the summation of the quantised analogue signals and the quantised spurious signals. While the same symbols without [ . . . ] brackets represent unquantised signals.

Beneficially, the ADC elements need not be of particularly high quality (low linearity, etc.) since it is possible having taken this approach, to adequately filter out unwanted frequencies even those generated by the non-linearity of the ADCs. Once the received analogue frequencies are digitised, the following functionality can be achieved by digital signal processing. Receiver architectures of this type have a number of important potentially advantageous features.

1. The splitting of digital data for distribution to multiple users is lossless—there is no degradation over a single user
2. Optimum beam formation: each user can optimise the RF spatial pattern they use to maximise the SNR/Signal to Interference/or ameliorate fading etc
3. The system will be easier to upgrade, and with computer power always increasing there is a growth path.
4. It is possible to carry out automatic multi-dimensional searching, allowing some signals to be detected even if there is a large interfering signal or intermodulation product on the same frequency (i.e. search in Frequency/Elevation/Azimuth)
5. It should be cheaper to maintain, run and add additional users etc
6. It should be more general purpose than a conventional system (i.e. the same hardware should be able to cope with conventional, TDMA and CDMA signals by reprogramming and should not need unique hardware for each)
7. It will allow different algorithms to be implemented, as they become available or are needed. As an example, altering the antenna pattern to track a signal using information from the demodulators is achievable using software alone.

A number of possible architectures for an RF receiver can be considered, most of them based on:

1. Multiple Wide band ADCs (say 32 ADCs each operating at 80 MHz)
2. Reducing each to narrower bandwidth channels (say 8 channels each of 5 MHz bandwidth/10 MHZ sampling rate) in order to provide more suitable data rate for subsequent processing units.
3. A multi-channel FFT engine in order to detect new signals in Frazel (Frequency—Azimuth and Elevation) space.
4. For each radio operator there is an effective multi-channel digital receiver bank to provide an optimised version of the SOI (Signal Of Interest) by converting it to baseband,
4.1 Removing in-band spurious signals, separating signals of interest from interference and remaining spurious signals which in the technique by which the ADCs are linearised; and
4.2 Ameliorating fading effects due to multi-path propagation etc.

Figure 1:
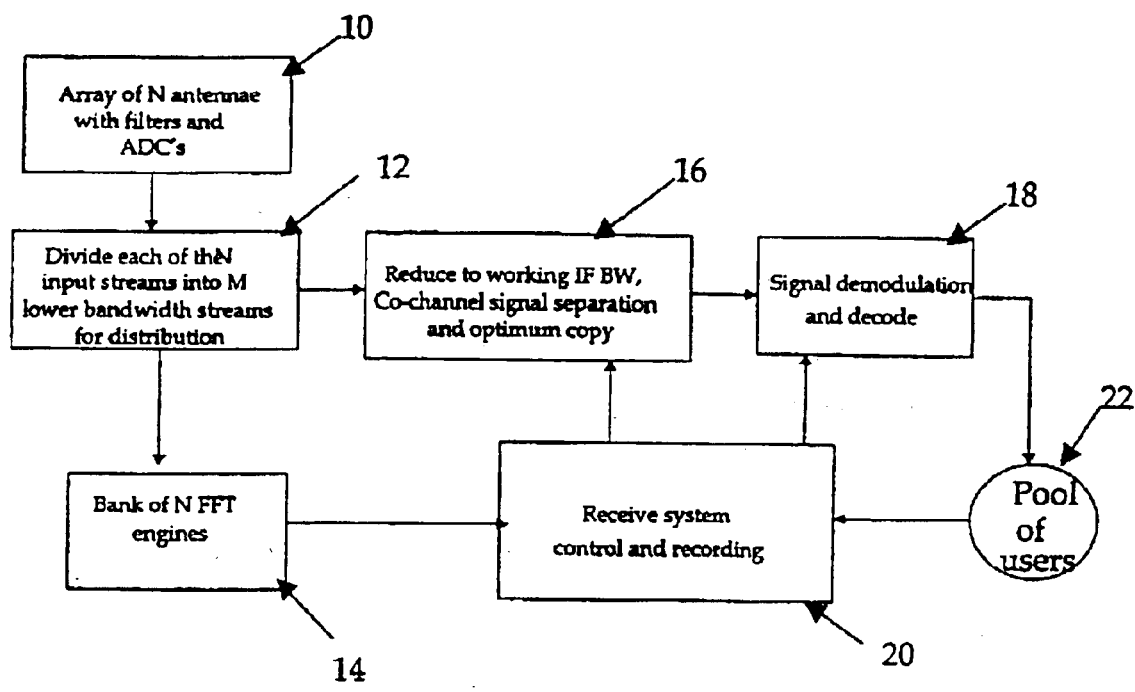
FIG. 1 depicts a functional architecture of an embodiment of an RF receiving system.

A functional architecture of an embodiment of an RF receiving system is depicted in FIG. 1. An array of N antennae with respective band pass filters and ADCs (10) feeds received signals and added spurious signals into a frequency channelisation device (12) which divides each of the N input streams into M (M may be 1 or more) predetermined bandwidth streams for distribution. The choice of particular bandwidth streams will depend on the information content of the analogue signal being received or expected to be received at the antennae.

In a first path, an FFT (14) is used to detect signals of interest, to determine where intermodulation products are likely to exist and to provide coarse data for the spatial processing used in the signal separation sub-systems. An alternative RP receiver architecture to detect signals of interest could occur as part of the signal separation process.

The second path (16) includes the detection of co-channels signals using algorithms such as Eigenvalue Decomposition. If these co-channel signals are spatially distinct they are separated using spatial processing algorithms such as, MUSIC and generalized side lobe cancellation and if they are spatially indistinct they are separated by Higher Order Statistical (HOS) processing algorithms such as Joint Approximate Diagonalization of Eigen-matrices (JADE). Signal classification techniques are then used to identify spurious signals, which are then removed. These processes linearise the output of the ADCs.

The final stage in the process is the demodulation and decoding (18) of the signals of interest.

Controlling the total system will be a control and recording system (20), that is typically accessed by a pool of users (22) each of whom are interested in a particular SOI at any one time.

Clearly, the invention is adapted to the RF receiver arrangement, but its primary architecture is evident in the array of ADCs, separated either spatially or with filters having a variable phase delay which in such a configuration can provide a higher dynamic range Analogue to Digital conversion than previously achievable.

In this embodiment, assume the receiver front end has N (32) Analogue to Digital Converters each operating at 80 MHz. In other applications variable and non-uniform sampling may be more appropriate and will give greater bandwidth for the same input and output conditions and allows spurious signals to be more readily identified and thus allows for greater rejection of those signals. In order to provide the best linearity from each channel it is possible for a non-linear correction system to be used on each channel that is similar to those based on work by Tsimbinos and Lever in the IEEE International Conference on Acoustics, Speech and Signal Processing, April 1994. As an example, to apply non-linear correction to a 20 MHz ADC requires 10 Gigaops of processing, so that the total processing for 32 channels at about 80 MHz is about 32×40 Gigaops=1.2 Teraops.

The data distribution system in which the input data is split into narrow bandwidth streams based on the frequency bandwidth of interest occurs in the frequency channelisation device (12). This is not strictly a desirable attribute, but the input data stream is 32 channels×80 MHz×16 bits=40 Gbits/second because it is beyond the capacity of current data buses. However if the raw input were divided into 8 data streams (by frequency) and a switching network provided to allow any subsequent processing to select which ever data stream it required they would each only require about 4 Gbits/second of bandwidth which should be available. In order to divide each of the 32 input streams into 8 there will need to be a filtering process that may be implemented as a series of 7 half band filters each of which would need to be at least a 20 tap filter. Thus the total processing in this data split, ignoring data separation and switching, is approximately 32 channels×80 MHz×7 filters×40 operations=716 Gflops. A further way to channelize is to sub-sample all the individual ADC rates or reduce their sampling rates. Provided that the total sample rate exceeds Nyquist, it is possible to use the spatial information to unambiguously identify and separate all the signals. In the spatial example it is a preferred embodiment that the separation would be done by Ricatti number theory.

At this point there are two separate paths, the first being the signal detection path (used to detect signals of interest, to determine where intermodulation products are likely to exist and to provide coarse data for the spatial processing used in the signal separation sub-systems). In that case, 32 channels of 10 MHz data will undergo a Fourier analysis and then subsequent processing to look for signals of interest. For the H.F. band a 100 Hz resolution is needed, and as such 100 FFTs per second each of length 128K would be needed. A 128K FFT involves about 8.7 million floating operations, and as such this stage will require 32 channels×100 FFTs/second×8.7 million operations=28 Gflops. However, following the Fourier transforms there is a second level of processing to combine the 32 channels spatially and to look for new signals. This leads to a processing demand similar to that of the FFT, and as such, it would be reasonable to allocate approximately 60 Gflops to this sub-system.

As depicted in FIG. 1 there is a signal separation and detection path, and there will need to be a separate system for each user. In the case of a preferable H.F. communications installation there are likely to be about 20 operator positions. For the first co-channel separation process each of the 32 channels is first reduced to a 10 KHz bandwidth using digital filtering techniques. A preferred example is a Digital Down Converter (DDC) and a dual rate filter. Typically the first filter will be a fast, but short FIR (say of the order 10 at the 10 MHz data rate—say about a 20 Mflops processing power requirement). After decimation (to, say a 1 MHz rate) there is a second longer filter (at the 1 MHz rate of order 100—say about a 20 Mflops processing power requirement) followed by decimation to the final 10 kHz bandwidth. Thus the 'narrow band receivers' have a total processing load of about 32 channels×20 Mflops=640 Mflops.

Following this there is a processing stage to provide the spatial processing, and possibly the HOS to identify and remove interference and intermodulation products. Different algorithms have very different processing loads, but the main factor is the number of antennas used, since this determines the number of in-band signals that can be separated. If there were 32 elements one could theoretically separate 31 signals, though in practice 20 would be more reasonable. One of the simpler algorithms requires about $4.Q^2$ operations per data point where Q is the number of channels used. A 10 kHz data rate would need a 40 Mflops processor. Many other algorithms such as Joint Approximate Diagonalization of Eigen-matrices (JADE) require several orders of magnitude higher processing throughput but this provides a realistic minimum processing load for the system.

The final stage in the process is the demodulation and decoding of the signal of interest, but given that this occurs with a single 10 kHz data stream it is likely to be less than 5 Mflops and as such can be neglected in this calculation.

Total Processing

It is now possible to see that the total processing requirement for digital receiving station with 32 antennas and 20 users is likely to be Front End 1200 Gflops Separation 680 Gflops Signal Search/Detection 60 Gflops Co-Channel 20 channels @ 40 Mflops 1 Gflops Thus, the total processing need is likely to exceed 2 Teraflops These figures are based on an indicative architecture and other variants would increase the processing load considerably due to the needs of other signal types. For example many systems used in the UHF band require the co-channel algorithms to operate over a signal bandwidth up to 3 MHz wide rather than the 3 kHz assumed here, which could add another 1000 Gigaflops to the co-channel separation processing load.

There are also good reasons to allow the demodulation/decoding algorithm outputs for a Signal of Interest to control the co-channel separation, or for higher order filters to be used in the initial separation sub-system, all of which could have profound ramifications on the actual processing load required.

In the embodiment disclosed herein, it is possible to use commercial ADCs preferably those with the best linearity. It is useful however to discuss current ADC performance and appreciate that ADCs with lesser linearity are also capable of being used as the subsequent digital processing can compensate for the results of their non-linearity.

ADC performance has been improving at a rate of about 1.5 bits every 6-8 years, and there became available an ADC with 14 bit linearity at 100 Msamples/second on the market in the year 2000. This is not, by itself adequate for a single channel H.F. receiver but it does offer a linearity of about 80 dB in the normal two-tone tests in which dynamic range is governed by the SFDR.

There is also research into optical ADCs which may result in an improvement in performance (e.g. greater than 100 dB SFDR with greater than 100 MHz bandwidth), and further research into non-linear compensation techniques will improve the linearity of existing ADCs. Furthermore, there are programs to improve the dynamic range of ADCs.

The concepts disclosed herein would benefit from any improvement in performance but they are not predicated on it.

In a normal RF environment, there are a large number of 'big' signals. For the purposes of estimation, it is assumed that there are between 10 and 50 such signals. In this case the largest signals in band are not as high as are used in testing the "two-tone dynamic range" and in many cases this means that a higher performance is possible, possibly closer to 90 dB SFDR Spatial Spread of Intermodulation Products A significant factor when considering the use of ADCs is that there will be spurious signals generated by them, commonly referred to as "birdies" especially from the larger received signals. However, the inventors have realized that this is not necessarily a disadvantage. Since these birdies have an apparent spatial origin, known co-channel techniques can be used to remove them in a similar way to other signals of interest.

One simple way in which this can be described is to say that, if an array is used rather than just a single receiver, the signals, noise and intermodulation products can be located in Frequency, Azimuth and Elevation (Frazel) space. It is known that any two signals in this space can be separated if they are located in different Frazel bins. For example if we have only one ADC we might have 10,000 frequency channels and if there were 5,000 birdies then half of the possible channels are filled. However, if we use an array of antennae, we would still have the same 10,000 frequency channels, but we also have 100 elevation angles and 300 azimuth bins. Tis means that the 5,000 birdies lie in 300,000,000 bins. If we assume a uniform distribution of signals, the probability that an SOI is co-located with a birdie is now only 1 in 60,000 which is no longer a problem.

Although this specification describes the benefits of the spatial separation of receivers, it should be noted that an array of ADCs separated by filters with a phase delay that varies with frequency could perform the same operation on single channel data. This is a consequence of the fact that most intermodulation products would have different phase relationships to real signals and this can be used to discriminate against them. Thus, this method can offer a generic approach to improving the performance of ADCs.

Co-channel separation algorithms are known in the art. The most common techniques are known for their ability to separate signals and can be found in texts such at Tsui, James Bao-yen, "Digital Microwave Receivers", 1989 Artec House, Inc.

Ghost Intermodulation Products

Other processing steps can improve the performance of the digital approach.

Since most of the intermodulation products do not come from physically realizable directions (i.e. are ghosts) they can be filtered out. A simple crossed array can remove about 75% of these products and a 3D array which is not practical for H.F., but is realizable at higher frequencies, can remove about 87% of the intermodulation products.

The mechanism behind this reduction can be explained by considering a uniform linear array in which 50% of the intermodulation products can be removed.

If there are a number of large signals that can create intermodulation products each of the large signals $S_i$ arrives from some specific Line of Bearing $(LOB)_i$ and is at some specific wavelength $\lambda_i$, and if the antenna array has an element spacing of D equal to a half wavelength spacing at the highest frequency of interest, then the actual signals have a phase difference from one element to another of $$\phi_i = 2\pi * D/\lambda i * \cos(LOB_i)$$

A typical intermodulation product would be the $3^{rd}$ order product created by two large signals. Its "true frequency" would be at $2*F1+F2$ and the resulting intermodulation product would have a phase difference between elements on the antenna array of $2*\phi_1+\phi_2$. However if the "true frequency" is above the Nyquist frequency of the system (i.e. >½ the sampling rate) it will be aliased to some apparent frequency less than Nyquist. Similarly, the measured phase angle in a real system can only be between $\pm\pi$. These two phenomena have the overall results of randomizing the frequency and phase of all intermodulation products over the range 0 to $F_{max}$ and from $\pm\pi$ respectively.

However real signals come from real directions and at any spot frequency the maximum phase shift that can be measured between array elements is $$\phi_{max} = 2\pi * (D/\lambda)$$

For a wide band array the spacing is set so $D=½\lambda_{max}$ in order to avoid ambiguities and the range of "real $\phi$" can be seen to be proportional to frequency.

Figure 6:
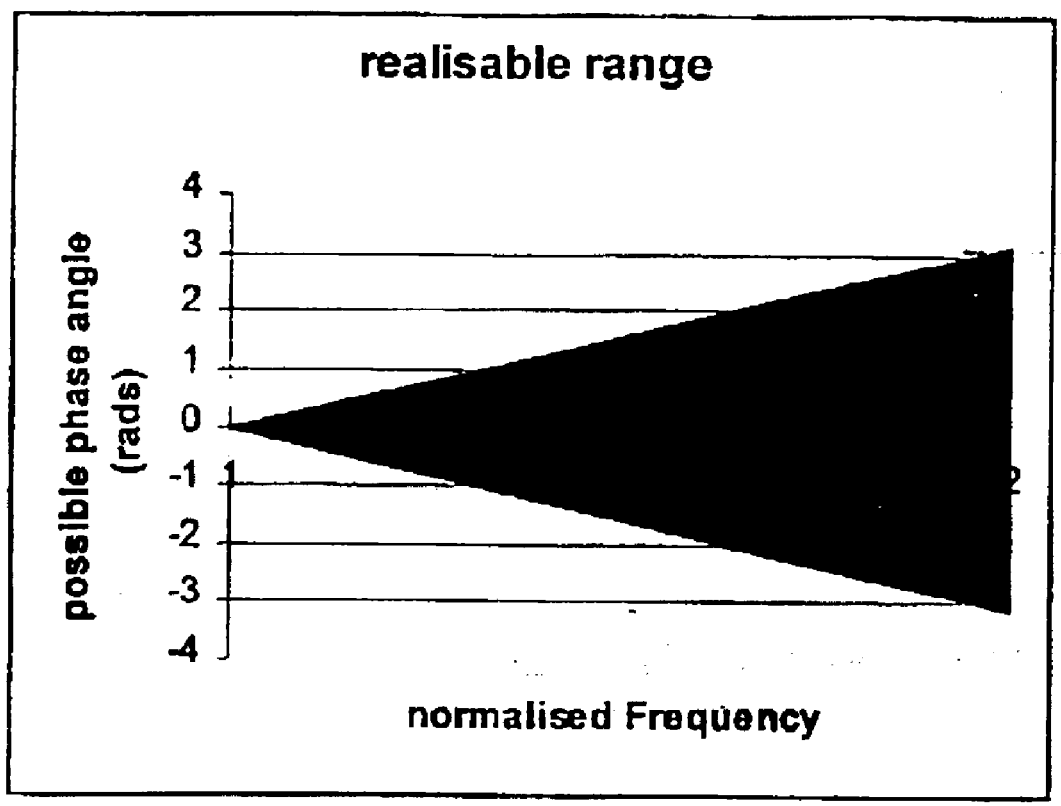
FIG. 6 depicts a phase-frequency relationship between the real and imaginary intermodulation products the imaginary of which are generated by non-linearity in the A–D conversion process.

Referring to FIG. 6 only 50% of the "phase-frequency" range has physical meaning, and as no real signal can have a phase angle between elements which are outside of this region, then any "signal" with such a phase angle must be spurious and can be ignored.

It is anticipated that the intermodulation products are evenly distributed within the phase-frequency space, and hence it is therefore anticipated that 50% of all intermodulation products can be removed using a simple, linear (one-dimensional) array of antennae.

Extending this reasoning into two dimensions, a two-dimensional array will allow a simple filter to remove 1-π/12, or about 74% of all intermodulation products generated by the ADCs. A three-dimensional array would permit 1-π/24 or about 87% of all intermodulation products to be removed since they do not come from physically realizable space—i.e. they are "ghosts".

Although three-dimensional arrays are physically realizable in the microwave bands, this embodiment using digital array architecture is in the H.F. band. In this band the 87% "de-ghosting" level is seen as an upper limit that may be achievable with advanced antenna array architectures whilst the 74% de-ghosting is a lower level that can be achieved readily with a simple two-dimensional, or crossed array.

Use of High Order Statistics

It has been described that it is possible using a spatial array of ADCs to remove the majority of intermodulation products and to separate most SOIs from the remaining intermodulation products since they will seem to come from different directions.

However, there is still a chance that a real signal will coincide with an intermodulation product in the full Frazel space (i.e. same frequency, azimuth and elevation). If this occurs it will then be necessary to use a High Order Statistical (HOS) based separation which can exploit the fact that the intermodulation signals will be statistically quite different from almost all real signals. A number of different HOS techniques are available —usually based on the use of 4th order cumulants. JADE is arguably the best known.

The statistical difference is mainly brought about by the process by which an intermodulation product is formed. For example, one of the large intermodulation products is the third harmonic of a signal (i.e. 3F), and if the original SOI were a BFSK signal with two tones separated by 1 kHz the resulting third harmonic would have 3 kHz separations and hence different statistics.

Noise in ADC Systems

Even if most of the intermodulation products can be removed, and then co-channel algorithms used to separate those remaining from SOIs, there is still a finite amount of noise generated in an ADC and this noise floor may determine the ultimate dynamic range available for the array. In determining the noise floor of the ADC's the main considerations will be:

1. For a typical ADC the noise floor is about 2 bits below the highest spurs
2. For an array with N elements, a reasonable assumption is that the SNR will increase by √N since signals add coherently and noise incoherently.
3. In an array in which the total noise is distributed over all Frazel bins, the total noise on any one receiver channel could be quite low.
4. The actual noise may be coloured and may seem to favour some specific directions, which may reduce the apparent noise in other directions. It should be noted that the actual, physical noise may be directional (e.g. lightning strikes or power line noise in the RF environment, or highly correlated noise due to jitter on the sampling clock) and may not appear evenly distributed throughout Frazel space.
5. The System Noise Floor may be dominated by rounding errors in the signal processing which is determined principally by the arithmetic resolution and the number of operations required in the algorithm.

Given these factors it becomes difficult to determine the actual noise floor and hence the maximum available dynamic range until the system design is finalized. However, it would be preferable to produce a receiving system with −20 dbm signals at the input, and to still be able to detect and demodulate conventional narrow band signals such as Morse code at −150 dbm. This would require a 130 dB dynamic range, a figure that may be at least 30 dB higher than can be achieved with current technology, but would appear achievable.

One of the interesting features of the digital approach to a receiver array is that many of the traditional metrics for measuring the RF performance are not readily applicable. For example the most widely used metric in conventional receivers is the Spurious Free Dynamic Range, but as described many of the birdies are 'ghosts' and:

1. if spatially separate, can be removed using spatial processing to separate them from the signals of interest; and
2. if co-existing in the same Frazel cell with an SOI, they can be identified and removed using HOS algorithms.

Given this, the best metric is not the SFDR of the system, but rather the probability of detecting and being able to demodulate a signal at a given power level in a specific Frazel cell. Thus the operating dynamic range can be much greater than the SFDR of the system and for the purposes of this specification, it is assumed that the "effective SFDR" of the receiver is a sensible metric for comparison purposes between digital and non-digital systems.

Performance of an Array

Having looked at the main parameters that are being considered, the best ADCs are achieving aperture jitters which approach 0.5 picoseconds as was shown in the study Walden "ADC Survey and Analysis" IEEE SAC vol 14, #4 at FIG. 5. The best ADC currently available with a 75 MHZ-sampling rate offers an SFDR of almost 14 bits (i.e. 84 dB).

When using the invention co-channel separation algorithms have demonstrated that a simple 8-channel system can realize major benefits. A typical example would be a weak signal brought from more than 20 dB below a large signal on the same frequency to greater than 20 dB above the signal. This suggests that an "array gain" of greater than 40 dB was being achieved. When a 32-channel system is used it could be expected that the performance improvement could be equivalent to an additional 8 bits and implies an effective SFDR of 20 bits or 120 dB. This is approaching the required 130 dB dynamic range.

A concern with the direct digitising array concept is that the processing load is very high. As was shown in an earlier part of the specification, the processing load is in the Tera-flops/Tera-ops region (Tflops/Tops). Although this is high it should be noted that:

1. Processing power appears to double every 18 months or so, and processing that is impractical today may be possible in the near future.
2. Much of the processing is regular and can be done in parallel and therefore can be implemented in dedicated signal processing chips
3. It is possible to produce a systolic array capable of operating at 10 Gops in 10 square mm of silicon using 0.35 micron Complementary Metal Oxide Semiconductor (CMOS) technology today and as such 1 tops of processing would require a bout 10 chips using 0.25 micron technology, which could be implemented on a standard VERSA Module Eurocard (VME) card.

For well-defined operations such as frequency filtering and channelisation, it will be relatively easy to implement the required computing rates. However, for algorithms that are more sophisticated such as JADE, or a HOS algorithm, they can be implemented using a cluster of general purpose computers, but the high rate of data I/O may be significant.

Although there are a number of major issues that need to be resolved, it is believed that:

1. a direct digitising array system will perform better than an individual channel,
2. the performance will improve as the array size increases, and
3. the actual performance of the system will depend on the number of channels, the fidelity of the ADCs and the subsequent processing.

It is anticipated that a direct digitising array processor will outperform existing analogue based receiving systems for the H.F. band, and offer new possibilities in higher frequency domains.

It will be appreciated by those skilled in the art, that the invention is not restricted in its use to the particular application described and neither is the present invention restricted in its preferred embodiment with regard to the particular elements and/or features described or depicted herein. It will be appreciated that various modifications can be made without departing from the principles of the invention, therefore, the invention should be understood to include all such modifications within its scope.

What is claimed is:

1. An analogue to digital converter apparatus for converting one or more analogue signals arriving at a plurality of spatially separated receiver elements, the apparatus comprising:
    a respective plurality of receive elements and analogue to digital converters (ADC's), each receive element and ADC exhibiting non-linear effects in the analogue and/or digital processes of receiving and converting received analogue signals from respective receive elements and generating respective ADC outputs that are digital representations of received signals plus spurious signals resulting from said non-linear effects:
    processing means configured to identify in said ADC outputs said spurious signals by
    (a) analysis of the phase relationships of said ADC outputs according to the spatial and phase relationships between said receive elements; and/or
    (b) analysis by High Order Statistical techniques of said ADC outputs; and
    a filter to remove identified spurious signals.

2. An analogue to digital conversion apparatus according to claim 1, wherein the process is configured such that said analysis of said phase relationships and said High Order Statistical analysis are performed in parallel to, or in series with each other.

3. An analogue to digital conversion apparatus for converting to a digital representation one or more analogue signals arriving at a receive element providing a receive output, the apparatus comprising:
    one or more variable phase delay means for generating a plurality of phase delayed versions of said receive output,
    one or more respective analogue to digital converters (ADCs) for the or each variable phase delay means, wherein said receive element, variable phase delay means and each ADC exhibits non-linear effects in the analogue and/or digital processes of receiving, delaying and/or converting analogue signals and generating respective ADC outputs which are the digital representations of receive signals and spurious signals resulting from said non-linear effects;
    processing means configured to identify said spurious signals by (a) analysis of the phase relationships of said ADC outputs according to the phase delays introduced by said variable phase delay means, and/or (b) High Order Statistical analysis of said ADC outputs and;

filter means to remove identified spurious signals.

4. An analogue to digital conversion apparatus according to claim 3, wherein said analysis of said phase relationships and said High Order Statistical analysis are performed in parallel to, or in series with each other.

5. An analogue to digital conversion apparatus according to claim 4, further comprising channelisation means to divide the said ADC outputs into multiple channels prior to processing and filtering.

6. An analogue to digital conversion apparatus according to claim 5, further comprising a synthesis means to reconstitute two or more of said multiple channels into a processed and filtered digital representation of said one or more analogue signals.

7. A method for identifying and filtering spurious signals from the digital representations of one or more signals, comprising:

(a) receiving at a plurality of spatially separated receiver elements, one or more analogue signals, each said receiver element contributing spurious signals as a result of the non-linear properties of the analogue process of receiving said one or more signals;

(b) receiving at a respective plurality of analogue to digital converters (ADC's) the output of a said receiver element, each ADC contributing spurious signals as a result of the non-linear properties of the analogue and digital processes conducted by said ADC for converting the output of a respective receive element into digital representations which include said signals and spurious signals;

(c) processing said digital representations to identify therein said spurious signals by (i) analysis of the phase relationships of said ADC outputs according to signals and spurious signals to the spatial and phase relationships between said receive elements; and/or (ii) performing High Order Statistical analysis of said ADC outputs; and (d) filtering to remove identified spurious signals.

8. A method according to claim 7, wherein said analysis of said phase relationships and said High Order Statistical analysis are performed in parallel to, or in series with each other.

9. A method for identifying and filtering spurious signals from the digital representations of one or more signals, comprising:

(a) receiving at a receiver element one or more analogue signals providing a receive output, said receiver element contributing spurious signals as a result of the non-linear properties of the analogue process of receiving said one or more signals;

(b) receiving at one or more variable phase delay means said receiver output and generating a plurality of phase delayed versions of said output, said variable phase delay means contributing spurious signals as a result of the non-linear properties of the analogue process of generating said phase delayed versions;

(c) providing an analogue to digital converter (ADC) for the or each variable phase delay means, each ADC contributing spurious signals as a result of the non-linear properties of the analogue and digital processes conducted by said ADC for converting the output of a respective phase delay means into digital representation;

(d) processing said digital representations to identify said spurious signals by (i) analyzing the phase relationships of said ADC outputs according to the phase delays introduced by said variable phase delay means, and/or (ii) performing High Order Statistical analysis of said ADC outputs; and (e) filtering to remove said identified spurious signals.

10. A method according to claim 9, wherein said analysis of said phase relationships and said High Order Statistical analysis are performed in parallel to, or in series with each other.

11. A method according to claim 7, 8, 9 or 10, wherein creating said digital representations of step (c) includes dividing said digital representations into multiple channels.

12. A method according to claim 11, comprising the further step:

(f) synthesizing said digital representations provided by said filtering step (e) to reconstitute two or more of said multiple channels into a processed and filtered digital representation of said one or more analogue signals.

* * * * *